(12) United States Patent
Ha et al.

(10) Patent No.: US 7,534,704 B2
(45) Date of Patent: May 19, 2009

(54) THIN LAYER STRUCTURE AND METHOD OF FORMING THE SAME

(75) Inventors: Jae-Kyu Ha, Suwon-si (KR); Jun Seo, Suwon-si (KR); Min-Chul Chae, Suwon-si (KR); Yong-Sun Ko, Suwon-si (KR); Young-Mi Lee, Yongin-si (KR); Jae-Seung Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 376 days.

(21) Appl. No.: 11/449,839

(22) Filed: Jun. 9, 2006

(65) Prior Publication Data

US 2006/0286298 A1 Dec. 21, 2006

(30) Foreign Application Priority Data

Jun. 16, 2005 (KR) ...................... 10-2005-0052049

(51) Int. Cl.
*H01L 21/20* (2006.01)
(52) U.S. Cl. ................................ 438/486; 257/E21.562
(58) Field of Classification Search ................. 438/222, 438/226, 486, 489, 607; 257/E21.132, E21.562
See application file for complete search history.

(56) References Cited

U.S. PATENT DOCUMENTS 4,874,718 A * 10/1989 Inoue ......................... 438/481
6,617,226 B1 * 9/2003 Suguro et al. ............... 438/489

FOREIGN PATENT DOCUMENTS

| JP | 11-087352 | 3/1999 |
| KR | 10-2004-0050517 | 6/2004 |
| KR | 10-2005-0009529 | 1/2005 |

* cited by examiner

*Primary Examiner*—Chandra Chaudhari
(74) *Attorney, Agent, or Firm*—Harness, Dickey & Pierce

(57) ABSTRACT

In a thin layer structure and a method of forming the same, a first preliminary insulation pattern is formed on a substrate and includes a first opening exposing the substrate. One or more preliminary seed patterns including single crystalline silicon are formed in the first opening. A second insulation layer is formed on the first preliminary insulation pattern and the one or more preliminary seed patterns. A second insulation pattern, a first insulation pattern and one or more seed patterns are formed by etching the first and second insulation layers and the one or more preliminary seed patterns. The second insulation pattern includes a second opening having a flat bottom portion. A single crystalline silicon pattern is formed in the second opening, wherein a central thickness of the single crystalline silicon pattern is substantially identical to a peripheral thickness thereof, thereby reducing or preventing a thinning defect in a semiconductor device.

17 Claims, 10 Drawing Sheets

THIN LAYER STRUCTURE AND METHOD OF FORMING THE SAME

PRIORITY STATEMENT

This application claims priority under 35 USC § 119 to Korean Patent Application No. 2005-52049 filed on Jun. 16, 2005, the entire contents of which is herein incorporated by reference.

BACKGROUND OF THE INVENTION

1. Field of the Invention

Example embodiments of the present invention relate to a method of forming a thin layer structure and more particularly, to a single crystalline thin layer structure and method of forming the same.

2. Description of the Related Art

Conventionally, solid materials may be classified into single-crystal material, poly-crystal material and amorphous material according to a crystal structure thereof. A single crystal material has a unit crystal structure having a regular arrangement, and in contrast, the poly-crystal material has a plurality of unit crystal structures having an irregular and/or random arrangement. An amorphous material has no crystal structure, and atoms may be irregularly and/or randomly arranged in the amorphous material.

A poly-crystal material generally contains a plurality of grain boundaries in the material due a plurality of unit crystal structures, each of which may be aligned in different directions, and carriers such as electrons and holes may be hindered from moving and/or being controlled in the material due to the plurality of grain boundaries, thereby deteriorating electric characteristics of the poly-crystal material. In contrast, a single-crystal material has almost no grain boundaries due to the single-crystal structure of the single-crystal material. Accordingly, carriers may move relatively freely and may be more controllable in a single crystal material than in a poly-crystal material. As a result, electric characteristics of a single-crystal material may be considered superior to that of a poly-crystal material.

In light of the above, a semiconductor device having a stacked structure such as a thin-film transistor (TFT) or having a multilayer structure such as a system-on-chip (SOC) device may include at least one single-crystal thin layer as a channel layer for the semiconductor device.

An amorphous silicon layer may be formed on a seed layer comprising single-crystalline silicon and a crystal structure of the amorphous silicon layer may be transformed into a single-crystal structure using a heat treatment to form a single-crystalline silicon layer.

Alternatively, a single-crystalline silicon layer may be formed by a damascene process. A selective epitaxial growth (SEG) process may be performed in an opening through which a seed layer comprising single-crystalline silicon may be partially exposed until the single-crystalline silicon is grown to a top portion of the opening, thereby forming a single-crystalline silicon layer in the opening. An SEG process may have long processing times and high processing costs, but may result in fewer processing defects and an improved channel layer.

FIG. 1 is a photograph taken by a transmission electron microscope (TEM) of a single crystalline silicon layer formed by a conventional damascene process.

As shown in FIG. 1, according to the conventional damascene process, a silicon oxide fence 16 is created on a seed layer pattern 10 around sidewalls of an opening 12. The seed pattern 10 may be over-etched in forming the opening 12 to sufficiently expose the seed pattern 10 through the opening 12. However, because the seed pattern 10 may be inclined, a small amount of etching gas may be supplied to the seed pattern 10 around the sidewalls of the opening 12, which may form a silicon oxide fence 16 on a seed layer pattern 10 around sidewalls of the opening 12.

A silicon oxide fence 16 may prevent the silicon in the seed pattern 10 from growing so the single crystalline silicon layer 14 locally formed may have a smaller thickness at a bottom portion around the seed pattern 10. For example, the single crystalline silicon layer formed may not be as thick at a portion around the seed pattern 10 due to the silicon oxide fence 16.

If the single crystalline silicon layer is thinner around the seed pattern 10, the ability of carriers to freely move may be reduced, thereby reducing an operating speed of a semiconductor device including the non-uniform single crystalline silicon layer. Further, the smaller thickness of the single crystalline silicon layer around the seed pattern 10 may result in a reduced contact area between the single crystalline silicon layer and the contact plug, thereby increasing an electrical resistance of the contact plug.

SUMMARY OF THE INVENTION

Example embodiments of the present invention provide a thin layer structure and a method of forming a thin layer structure that includes a single crystalline silicon layer having a thickness around a seed portion that is substantially similar to the remaining portion of the single crystalline silicon layer.

An example embodiment of the present invention provides a thin layer structure. The thin layer structure may include a first insulation pattern arranged on a substrate, at least one seed pattern in a first opening, a second insulation pattern arranged on the first insulation pattern and the at least one seed pattern and lower and upper single crystalline silicon patterns. The first insulation pattern may include the first opening through which the substrate may be partially exposed, and the at least one seed pattern may include single crystalline silicon. The second insulation pattern may include a second opening through which the at least one seed pattern may be exposed. The lower single crystalline silicon pattern may be formed in the second opening, and the upper single crystalline silicon pattern may be formed on the lower single crystalline silicon pattern and the second insulation pattern, so that the lower single crystalline silicon pattern may be covered with the upper single crystalline silicon pattern.

An example embodiment of the present invention provides a method of forming a thin layer structure. The method of forming the thin layer structure may include forming a first preliminary insulation pattern on a substrate, the first preliminary insulation pattern including a first opening through which the substrate is partially exposed; forming at least one preliminary seed pattern in the first opening, the at least one preliminary seed pattern includes single crystalline silicon; forming a second insulation layer on the first preliminary insulation pattern and the at least one preliminary seed pattern; forming a second insulation pattern, a first insulation pattern and at least one seed pattern by partially etching the second insulation layer, the first preliminary insulation pattern and the at least one preliminary seed pattern, the second insulation pattern including a second opening having a flat bottom; and forming at least one single crystalline silicon pattern in the second opening.

According to example embodiments of the present invention, the second opening, which may function as a mold pattern for forming the single crystalline silicon pattern, has a flat bottom portion, so that a silicon oxide fence may be reduced or prevented at a portion around the at least one seed pattern. Accordingly, a local thickness loss of the thin layer structure may be reduced or prevented to thereby reduce a thinning defect in a manufacturing process for a semiconductor device.

According to an example embodiment of the present invention, a lower single crystalline silicon pattern may be formed on at least one seed pattern, so that a thin layer structure has lower and upper single crystalline silicon patterns that are sequentially stacked on the at least one seed pattern. As a result, a central thickness of the thin layer structure may be greater than a peripheral thickness thereof, which may improve carrier mobility of the thin layer structure. For example, when a contact plug is formed on the thin layer structure according to an example embodiment of the present invention including the lower and upper single crystalline silicon patterns, a contact area between the contact plug and the thin layer structure is increased, which may reduce an electrical resistance of the contact plug. Accordingly, when the thin layer structure is used as a channel layer in a semiconductor device, an operation speed may be sufficiently improved.

BRIEF DESCRIPTION OF THE DRAWINGS

The above and other features and/or advantages of the example embodiments of the present invention will become more readily apparent by reference to the following detailed description when considered in conjunction with the accompanying drawings, in which.

Figure 1:
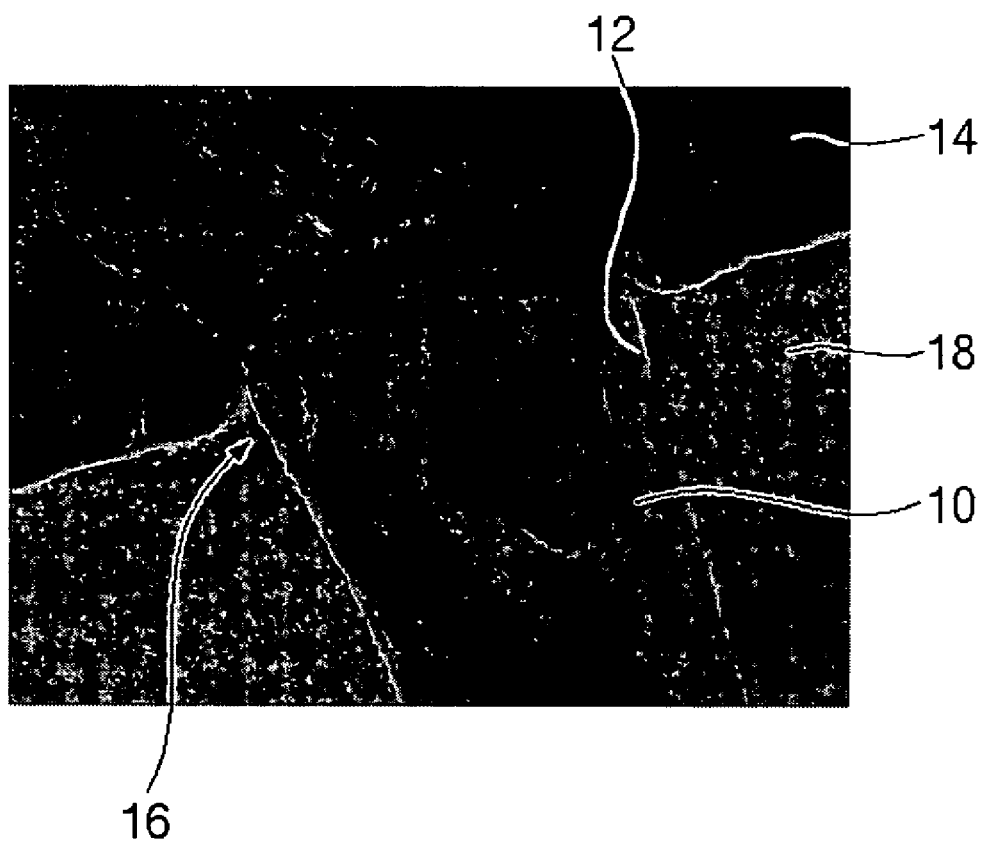
FIG. 1 is a TEM photograph of a single crystalline silicon layer formed by a conventional damascene process.

DESCRIPTION OF EXAMPLE EMBODIMENTS
OF THE PRESENT INVENTION

Example embodiments of the present invention are described more fully hereinafter with reference to the accompanying drawings. This invention may, however, be embodied in many different forms and should not be construed as limited to the example embodiments set forth herein. Rather, the example embodiments of the present invention are provided so that this disclosure will be thorough and complete, and will fully convey the scope of the invention to those skilled in the art. In the drawings, the size and relative sizes of layers and/or regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments and/or intermediate structures of the invention. As such, variations from the shapes of the illustrations as a result, for example, of manufacturing techniques and/or tolerances, are to be expected. Thus, the invention should not be construed as limited to the particular shapes of regions illustrated in the example embodiments of the present invention but are to include deviations in shapes that result, for example, from manufacturing. For example, an implanted region illustrated as a rectangle may have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Accordingly, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
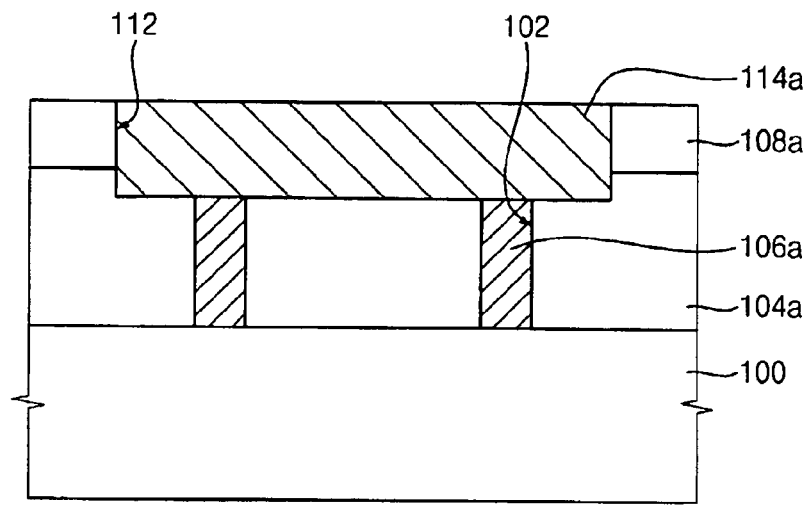
FIG. 2 is a cross sectional view illustrating a silicon thin layer structure according to an example embodiment of the present invention.

FIG. 2 is a cross sectional view illustrating a silicon thin layer structure according to an example embodiment of the present invention.

Referring to FIG. 2, a silicon thin layer structure according to an example embodiment of the present invention may include a substrate 100 of which a top surface includes single crystalline silicon. A substrate 100 may include a silicon substrate or a silicon-on-insulator (SOI) substrate. A unit device of a semiconductor device, for example, a metal-oxide silicon (MOS) transistor may be formed on the substrate 100.

A first insulation pattern 104a may be formed on a substrate 100 and the substrate 100 may be partially exposed through a first opening 102 in the first insulation pattern 104a. The first insulation pattern 104a may include silicon oxide.

A seed pattern 106a including single crystalline silicon may be formed in the first opening 102 by a selective epitaxial growth (SEG) process using the substrate 100 as a seed.

A second insulation pattern 108a may be formed on the first insulation pattern 104a and the seed pattern 106a, and a second opening 112 may be formed through the second insulation pattern 108a A diameter of the second opening 112 may be greater than the thickness of the second insulation pattern 108a. Top surfaces of a seed pattern 106a and a portion of a first insulation pattern 104a may be exposed through the second opening 112. Accordingly, the first insulation pattern 104a may be partially recessed and partially exposed through the second opening 112. In an example embodiment of the present embodiment, the top surfaces of the seed pattern 106a and the first insulation pattern 104a exposed through the second opening 112 are coplanar with each other, so no inclination is formed on the top surfaces of the seed pattern 106a and the first insulation pattern 104a.

According to an example embodiment of the present invention, a second insulation pattern 108a including the second opening 112 may function as a mold pattern for a single crystalline silicon pattern 114a, and a seed pattern 106a may function as a seed for the single crystalline silicon pattern 114a in a SEG process. According to an example embodiment of the present invention, at least one top surface of a seed pattern 106a is exposed through the second opening 112. In FIG. 2, top surfaces of two seed patterns 106a are exposed through the second opening 112, and a diameter of the second opening 112 is greater than a diameter of the first opening 102. A single crystalline silicon pattern 114a may be formed in the second opening 112 by a SEG process using a seed pattern 106 as a seed.

A unit element (not shown) for a semiconductor device such as a MOS transistor may be formed on the single crystalline silicon pattern 114a.

According to the thin layer structure of an example embodiment of the present invention, no inclination is formed on the top surfaces of the seed pattern 106a and the first insulation pattern 104a exposed through the second opening 112, and a silicon oxide fence is not created at a top portion of the seed pattern 106a around a bottom portion of the second opening 112. Accordingly, a single crystalline silicon pattern 114a has a uniform thickness without a loss of thickness at a bottom portion thereof around the seed pattern 106a.

FIGS. 3 to 8 are views illustrating a method of forming the silicon thin layer structure according to an example embodiment of the present invention as shown in FIG. 2.

Figure 3:
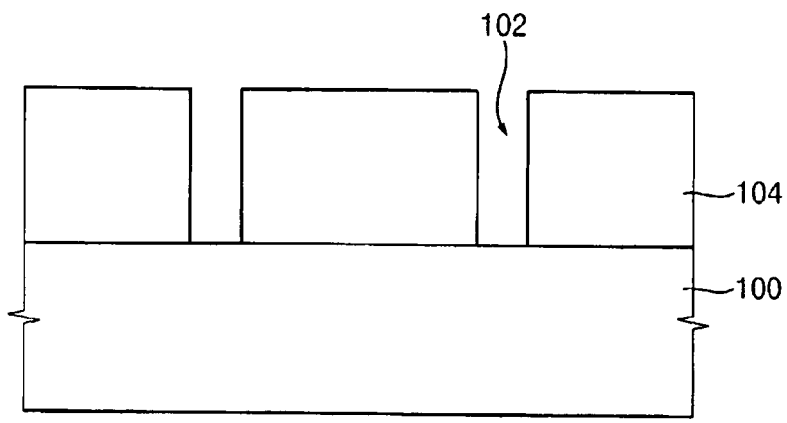
FIGS. 3 to 8 are views illustrating a method of forming a silicon thin layer structure in accordance with an example embodiment of the present invention.

Referring to FIG. 3, a substrate 100 of which a top surface includes single crystalline silicon may be provided for a semiconductor device. The substrate 100 may include a silicon substrate or a silicon-on-insulator (SOI) substrate, for example. A device isolation process and various unit processes for forming unit structures for a semiconductor device such as a MOS transistor may be formed on the substrate 100.

A first preliminary insulation layer (not shown) may be formed on the substrate 100. For example, silicon oxide may be deposited onto the substrate 100 by a chemical vapor deposition (CVD) process, thereby forming the first preliminary insulation layer on the substrate 100. When unit structures for a semiconductor device have already been formed on a substrate 100, a first preliminary insulation layer may be formed having a thickness sufficient to cover the unit structures. A planarization process may be further performed on a first preliminary insulation layer to planarize a top surface of the first preliminary insulation layer.

A first preliminary insulation layer may be partially etched away according to an example embodiment of the present invention to form a first opening 102 through which a substrate 100 is at least partially exposed. Accordingly, a first preliminary insulation layer may be formed into a first preliminary insulation pattern 104 using an etching process.

Figure 4:
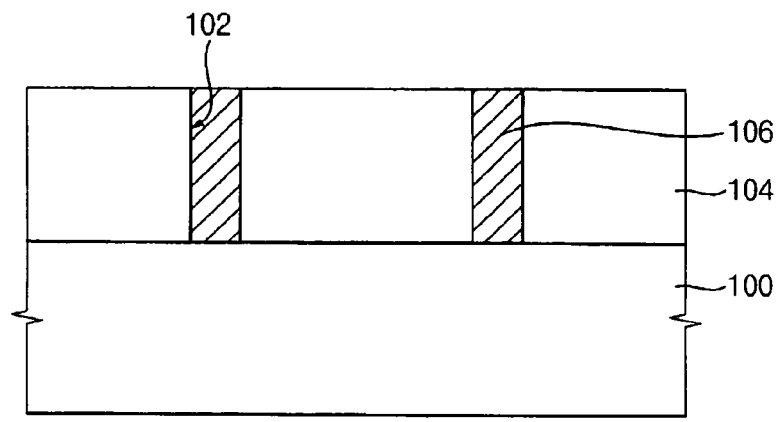

Referring to FIG. 4, a single crystalline silicon may be grown by a SEG process using an exposed substrate 100 in a first opening 102 as a seed, thereby forming a preliminary seed pattern 106 in the first opening 102.

Hereinafter, a process for forming a preliminary seed pattern 106 according to an example embodiment of the present invention is described.

A pre-cleaning process may be performed on a substrate 100, so that a native oxide layer on a portion of the substrate 100 exposed through the first opening 102 is removed.

Then, the SEG process may be performed on the portion of the substrate 100 exposed through the first opening 102 at a temperature within a range of about 750° C. to about 1,250° C. according to an example embodiment of the present invention. When the SEG process is performed at a temperature of less than about 750° C., single crystalline silicon is barely grown, and when the SEG process is performed at a temperature higher than about 1,250° C., the SEG process is not easily controlled due to a rapid growth of single crystalline silicon. Further, according to an example embodiment of the present invention, the SEG process is performed at a temperature within a range of about 800° C. to about 900° C.

A reaction gas for the SEG process may include a silicon source gas. Examples of the silicon source gas include silicon tetrachloride ($SiCl_4$), silane ($SiH_4$), and dichlorosilane ($SiH_2Cl_2$), trichlorosilane gas ($SiHCl_3$), etc. These reaction gases can be used alone or in a combination thereof. In an example embodiment of the present invention, silicon tetrachloride ($SiCl_4$) is used as the reaction gas.

According to an example embodiment of the present invention, single crystalline silicon (not shown) may be grown in the first opening 102 onto the first preliminary insulation pattern 104 around the first opening 102 so the first opening 102 is sufficiently filled with the single crystalline silicon.

According to an example embodiment of the present invention, a capping layer (not shown) may be formed on the first preliminary insulation pattern 104 to cover the single crystalline silicon. Then, the capping layer and the single crystalline silicon may be removed by a chemical mechanical polishing (CMP) process until a top surface of the first preliminary insulation pattern 104 is exposed, thereby forming a preliminary seed pattern 106 comprising single crystalline silicon in the first opening 102. Alternatively, forming the capping layer may be omitted to simplify a method according to an example embodiment of the present invention.

Figure 5:
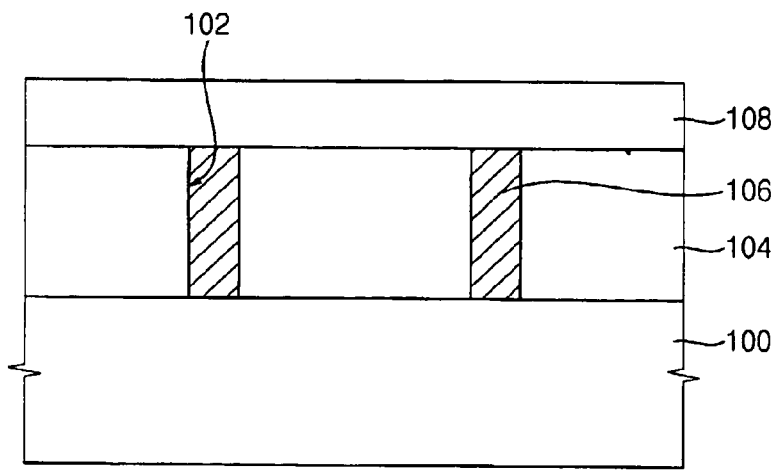

Referring to FIG. 5, a second insulation layer 108 may be formed on the first preliminary insulation pattern 104 and/or the preliminary seed pattern 106. For example, silicon oxide may be deposited onto the first preliminary insulation pattern 104 and the preliminary seed pattern 106 by a CVD process, thereby forming the second insulation layer 108. In a subsequent process, the second insulation layer 108 may be formed into a mold pattern for forming a single crystalline silicon pattern, so that the second insulation layer 108 may be formed having a thickness greater than the thickness of the single crystalline silicon pattern.

Figure 6:
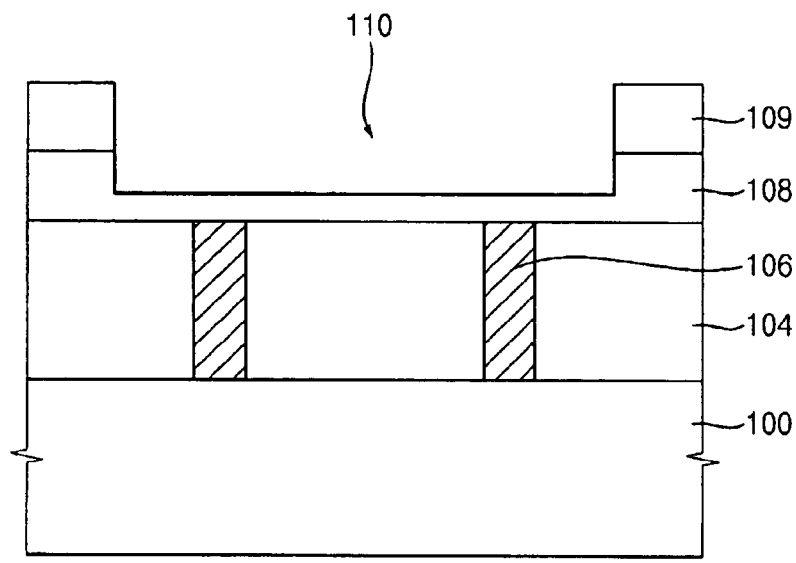

Referring to FIG. 6, a photoresist pattern 109 may be formed on the second insulation layer 108, and the second insulation layer 108 may be partially exposed through the photoresist pattern 109 at a portion above and corresponding to the preliminary seed pattern 106 and the first preliminary insulation pattern 104 around the preliminary seed pattern 106. In a subsequent process, a single crystalline silicon pattern may be formed corresponding to the portion exposed through the photoresist pattern 109.

The second insulation layer 108 may be partially removed to a predetermined thickness by a first etching process using the photoresist pattern 109 as an etching mask, and the preliminary seed pattern 106 may remain covered with the second insulation layer 108, thereby forming a second preliminary opening 110 in the second insulation layer 108. For example, the first etching process may include a dry etching process and may have an etching rate much greater than that of a second etching process that may be performed in a subsequent process so that the second preliminary opening 110 has a sidewall almost vertical to a bottom portion of the second preliminary opening 110. In an example embodiment of the present invention, trifluoromethane ($CHF_3$) gas and oxygen gas may be used as an etching gas for the first etching process.

Figure 7:
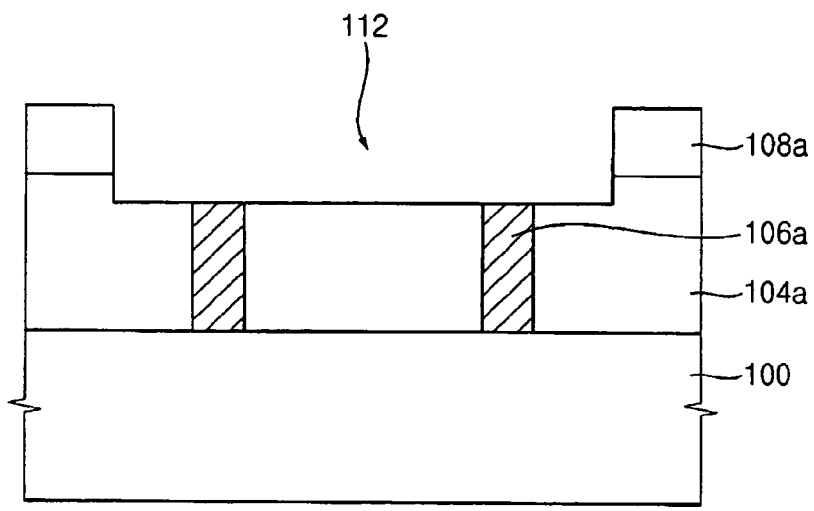

Referring to FIG. 7, the second insulation layer 108, the first preliminary insulation pattern 104 and the preliminary seed pattern 106, which may be exposed through the second preliminary opening 110, may be partially removed to a predetermined depth by a second etching process to form a second opening 112. According to an example embodiment of the present invention, the bottom of the second opening 112 may is flat. The first preliminary insulation pattern 104 around the preliminary seed pattern 106 is removed to a depth, so that the first preliminary insulation pattern 104 is recessed in the second opening 112. Further, the second insulation layer 108, the first preliminary insulation pattern 104 and the preliminary seed pattern 106 may be formed into a second insulation pattern 108a, a first insulation pattern 104a and a seed pattern 106a, respectively as shown in FIG. 7.

According to an example embodiment of the present invention, the second insulation layer 108, the first preliminary insulation pattern 104 and the preliminary seed pattern 106 are removed at the same rate in the second etching process, so that the bottom portion of the second opening 112 is formed flat. An etching rate of the second etching process may be slower than that of the first etching process. Carbon tetrafluoride ($CF_4$) gas and oxygen gas may be used as an etching gas for the second etching process.

At least one preliminary seed pattern 106 is etched away in the second etching process, so that at least one top surface of the preliminary seed pattern 106 is exposed through the second opening 112.

When a size of the second opening 112 is much larger than that of the top surface of the seed pattern 106a exposed through the second opening 112, the single crystalline silicon layer grown from one seed pattern 106a may not be sufficient for completely filling the second opening 112. Accordingly, as the size of the second opening 112 is larger, more of seed patterns 106a may be required. In the example embodiment of present invention shown in FIG. 7, two seed patterns 106a are exposed through the second opening 112.

According to a method of an example embodiment of the present invention as described with reference to FIGS. 6 and 7, the sidewall of the second opening 112 is substantially perpendicular to the bottom portion and the bottom portion of the second opening 112 is substantially flat.

Figure 8:
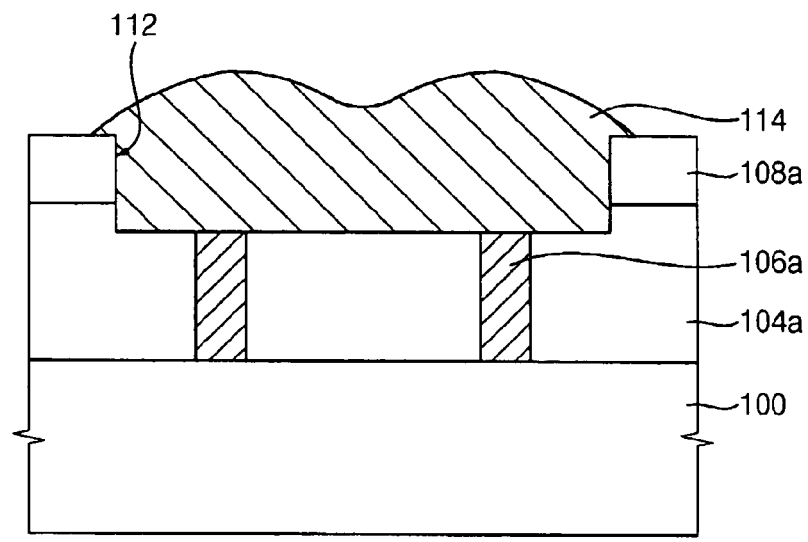

Referring to FIG. 8, a selective epitaxial growth (SEG) process may be performed using the at least one seed pattern 106a exposed through the second opening 112 as at least one seed, so that a single crystalline silicon layer 114 is grown from the at least one seed pattern 106a in the second opening 112 until the second opening 112 is sufficiently filled with the single crystalline silicon layer 114. The single crystalline silicon layer 114 may be formed on a top surface of the second insulation pattern 108a around the second opening 112. A process for forming the single crystalline silicon layer 114 is the same as the SEG process for forming the seed pattern 106a, so a detailed description of the process for forming the single crystalline silicon layer 114 is omitted for the sake of brevity.

Figure 18:
FIG. 18 is a TEM photograph of a single crystalline silicon layer in a second opening according to an example embodiment of the present invention as shown in FIG. 8.

FIG. 18 is a TEM photograph showing the single crystalline silicon layer in the second opening shown in FIG. 8.

Referring to FIG. 18, a bottom portion of the second opening 112, which may be a mold pattern for a single crystalline silicon pattern, is substantially flat, so that no silicon fence is created at the bottom portion of the second opening around the seed pattern 106a.

A capping layer (not shown) may be formed on the single crystalline silicon layer 114. The capping layer and the single crystalline silicon layer 114 may be removed and planarized by a polishing process such as a chemical mechanical polishing (CMP) process until a top surface of the second insulation pattern 108a is exposed. Accordingly, the single crystalline silicon layer remains only in the second opening 112, thereby forming a single crystalline silicon pattern 114a in the second opening 112, as shown in FIG. 2. The single crystalline silicon pattern 114a may function as a channel layer in a semiconductor device. Alternatively, the capping layer may be omitted to simplify the manufacturing.

According to an example embodiment of the present invention, a sequential performance of a damascene process and an SEG process forms a single crystalline silicon pattern having fewer crystal defects and superior electric characteristics compared with a single crystalline silicon pattern formed in a conventional manner. Further, no silicon oxide fence is created at the bottom portion of the second opening around the seed pattern, so that the single crystalline silicon pattern has a uniform thickness along the whole second opening according to an example embodiment of the present invention. Accordingly, if the single crystalline silicon pattern according to an example embodiment of the present invention is used as a channel layer in a stacked semiconductor device, electric characteristics and reliability of the semiconductor device may be improved.

Figure 9:
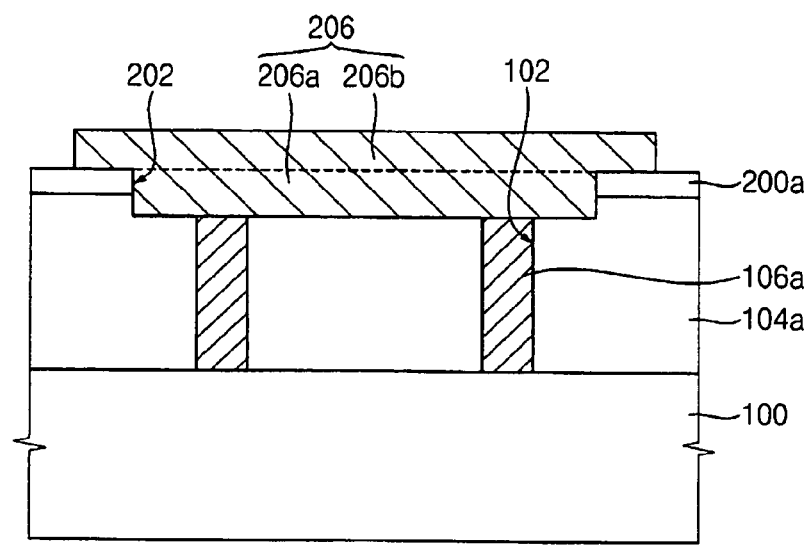
FIG. 9 is a cross sectional view illustrating a silicon thin layer structure according to an example embodiment of the present invention.

FIG. 9 is a cross sectional view illustrating a silicon thin layer structure according to an example embodiment of the present invention.

Referring to FIG. 9, a silicon thin layer structure includes a substrate 100 of which a top surface includes single crystalline silicon. The substrate 100 may include a silicon substrate or a silicon-on-insulator (SOI) substrate. A unit device of a semiconductor device, for example, a metal-oxide silicon (MOS) transistor may be formed on the substrate 100.

A first insulation pattern 104a may be formed on the substrate 100, and the substrate 100 may be partially exposed through a first opening 102 in the first insulation pattern 104a. For example, the first insulation pattern 104a may include silicon oxide.

A seed pattern 106a comprising single crystalline silicon may be formed in the first opening 102 by, for example, a selective epitaxial growth (SEG) process using the substrate 100 as a seed.

A second insulation pattern 200a including a second opening 202 may be formed on the first insulation pattern 104a and/or the seed pattern 106a. At least one seed pattern 106a is exposed through the second opening 202, and a bottom portion of the second opening 202 is flat according to an example embodiment of the present invention. For example, two seed patterns 106a may be exposed through the second opening 202.

The second insulation pattern 200a including the second opening 202 may function as a mold pattern for a lower single crystalline silicon pattern 206a, and the seed pattern 106a may function as a seed for the lower single crystalline silicon pattern 206a in a SEG process, so that the lower single crystalline silicon pattern 206a is formed on a top surface of the seed pattern 106a and a top surface of the first insulation pattern 104a around the top surface of the seed pattern 106a. A diameter of the second opening 202 may be larger than that of the first opening 102.

The lower single crystalline silicon pattern 206a may be formed in the second opening 202 by a SEG process using the seed pattern 106a as a seed.

According to an example embodiment of the present invention, an upper single crystalline silicon pattern 206b may be formed on the lower single crystalline silicon pattern 206a and on the second insulation pattern 200a.

Accordingly, a single crystalline silicon pattern 206 may include the lower single crystalline silicon pattern 206a located on the first insulation pattern 104a and the seed pattern 106a and the upper single crystalline silicon pattern 206b located on the lower single crystalline silicon pattern 206a and the second insulation pattern 200a. For example, as shown in FIG. 9, the lower single crystalline silicon pattern 206a is formed on the seed pattern 106a and the first insulation pattern 104a around the seed pattern 106a, and the upper single crystalline silicon pattern 206b is formed on the lower single crystalline silicon pattern 206a and the second insulation pattern 200a, so that a top surface of the lower single crystalline silicon pattern 206a is smaller than the top surface of the upper single crystalline silicon pattern 206b. Accordingly, a thickness of the single crystalline silicon pattern 206 is greater in the vicinity of the seed pattern 106a rather than far from the seed pattern 106a.

According to an example embodiment of the present invention, a thickness of the single crystalline silicon pattern 206 may be greater in the vicinity of the seed pattern 106a, which may enhance the mobility of carriers in a semiconductor device. For example, when a contact plug is formed on a single crystalline silicon pattern 206 including the lower and upper single crystalline silicon patterns 206a and 206b, a contact area between the contact plug and the single crystalline silicon pattern 206 is increased, thereby reducing an electrical resistance of the contact plug.

Figure 10:
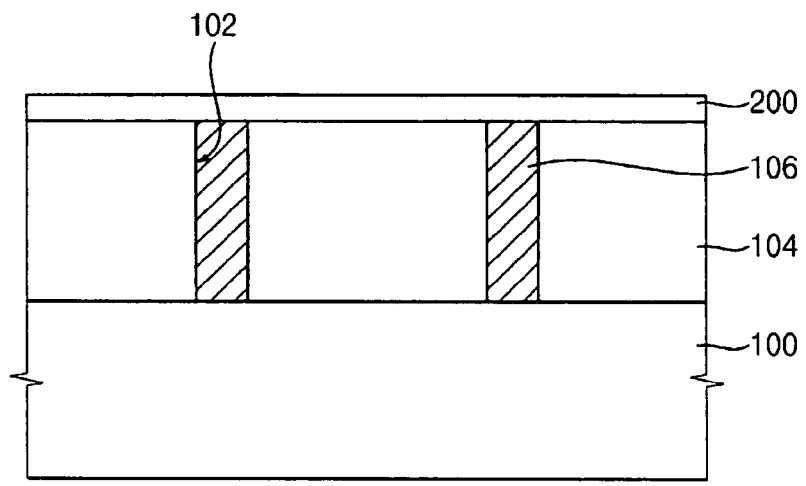
FIGS. 10 to 12 are cross sectional views illustrating a method of forming the silicon thin layer structure in accordance with an example embodiment of the present invention.
Figure 11:
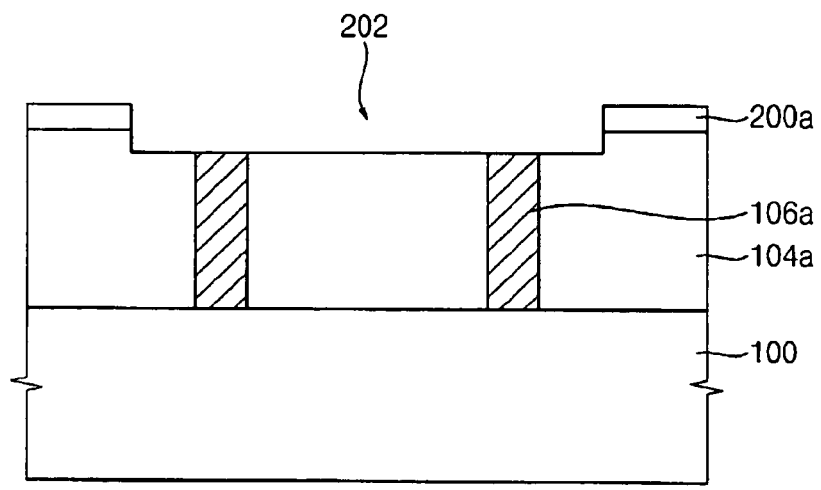
Figure 12:
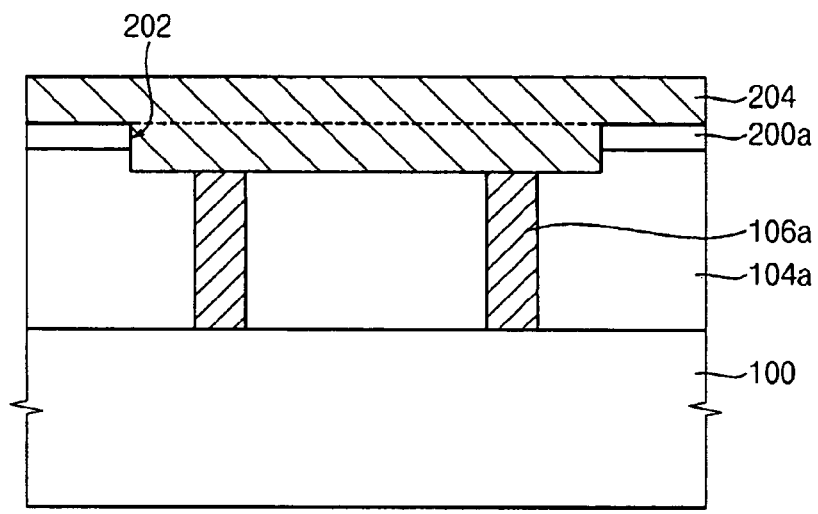

FIGS. 10 to 12 are cross sectional views illustrating a method of forming a silicon thin layer structure according to an example embodiment of the present invention as shown in FIG. 9. The method of forming the silicon thin layer structure according to the example embodiment of the present embodiment is the same as previously discussed except the process of forming a single crystalline silicon pattern as a channel layer. Accordingly, the detailed description of like features and/or processes that have been previously explained will be omitted hereinafter for the sake of brevity.

A first preliminary insulation pattern 104 and a preliminary seed pattern 106 may be formed on a substrate 100 as previously described with reference to FIGS. 3 and 4.

Referring to FIG. 10, a second insulation layer 200 may be formed on the first preliminary insulation pattern 104 and/or the preliminary seed pattern 106. For example, silicon oxide may be deposited onto the first preliminary insulation pattern 104 and the preliminary seed pattern 106, thereby forming a silicon oxide layer as the second insulation layer 200. A mold pattern for forming a lower single crystalline silicon pattern may be formed in the second insulation layer 200 in a subsequent process.

In an example embodiment of the present invention, the second insulation layer 200 may be formed to have a thickness less than or substantially equal to a thickness of a lower single crystalline silicon pattern. The thickness of the lower single crystalline silicon pattern will be described in more detail hereinafter.

Referring to FIG. 11, a photoresist pattern (not shown) may be formed on the second insulation layer 108, and the second insulation layer 200 may be partially exposed through the photoresist pattern at a portion corresponding to at least one preliminary seed pattern 106 and the first preliminary insulation pattern 104 around the at least one preliminary seed pattern 106. In a subsequent process, the lower single crystalline silicon pattern may be formed at a location corresponding to a portion exposed through the photoresist pattern.

The second insulation layer 200 may be partially removed to a specified thickness by a first etching process using the photoresist pattern as an etching mask and the preliminary seed pattern 106 may remain covered with the second insulation layer 200, thereby forming a second preliminary opening (not shown) in the second insulation layer 108. According to an example embodiment of the present invention, the first etching process may have an etching rate significantly greater than that of a second etching process that may be performed in a subsequent process, so that the second preliminary opening has a sidewall substantially vertical to a bottom portion of the second preliminary opening. For example, the second etching process may include a dry etching process using trifluoromethane ($CHF_3$) gas and oxygen gas as an etching gas.

The second insulation layer 200, the first preliminary insulation pattern 104 and the preliminary seed pattern 106 that may be exposed through the second preliminary opening may be partially removed to a specified depth by the second etching process, thereby forming a second opening 202. According to an example embodiment of the present invention, a bottom portion of the second opening 202 is substantially flat. The first preliminary insulation pattern 104 around the preliminary seed pattern 106 may be removed to a depth from a top surface thereof, so that the first preliminary insulation pattern 104 is recessed in the second opening 202. Further, the second insulation layer 108, the first preliminary insulation pattern 104 and the preliminary seed pattern 106 may be formed into a second insulation pattern 108a, a first insulation pattern 104a and a seed pattern 106a, respectively.

According to an example embodiment of the present invention, the second insulation layer 108, the first preliminary insulation pattern 104 and the preliminary seed pattern 106 are removed at substantially the same rate in the second etching process so that the bottom portion of the second opening 112 is formed substantially flat. An etching rate of the second etching process may be slower than that of the first etching process. For example, carbon tetrafluoride ($CF_4$) gas and oxygen gas may be used as an etching gas for the second etching process.

According to an example embodiment of the present invention, a depth of the second opening 202 is substantially identical to the thickness of the lower single crystalline silicon pattern, and the depth of the second opening 202 is greater than a thickness of the second insulation layer 200. As a result, the second insulation layer 200 may be formed having a thickness less than or substantially equal to the thickness of the lower single crystalline silicon pattern.

While an example embodiment of the present invention, as described above, discloses the subsequent first and second etching processes for forming the second opening 202, the second opening 202 may be formed only by the second etching process if the thickness of the second insulation layer 200 is less than about 200 Å without increasing an etching process time. Accordingly, the second opening 202 may also be formed only by the second etching process without the first etching process.

Referring to FIG. 12, a selective epitaxial growth (SEG) process may be performed using the seed pattern 106a, which may be exposed through the second opening 202 as a seed, so that a single crystalline silicon layer 204 is grown on the second insulation pattern 200a having a thickness sufficient to fill the second opening 202. According to an example embodiment of the present invention, the single crystalline silicon layer 204 has a thickness ranging from about 300 Å to about 3000 Å, so that a channel layer of a semiconductor device is formed to a sufficient thickness.

A process for forming the single crystalline silicon layer 204 is the same as the SEG process for forming the seed pattern 106a as described with respect to previous example embodiments of the present invention so detailed description of the process for forming the single crystalline silicon layer 204 is omitted for the sake of brevity.

The single crystalline silicon layer 204 may then be removed and planarized by a chemical mechanical polishing (CMP) process.

The single crystalline silicon layer 204 may then be partially removed by a patterning process, so that the single crystalline silicon layer 204 remains in the second opening 202 and on the second insulation pattern 200a around the second opening 202. As shown in FIG. 9, the lower single crystalline silicon pattern 206a may be formed in the second opening 202 and the upper single crystalline silicon pattern 206b may be formed on the second insulation pattern 200a and the lower single crystalline silicon pattern 206a, so that the lower single crystalline silicon pattern 206a is covered with the upper single crystalline silicon pattern 206b.

Accordingly, the single crystalline silicon pattern 206 includes the lower single crystalline silicon pattern 206a and the upper single crystalline silicon pattern 206b that are sequentially stacked on the seed pattern 106a and the first insulation pattern 104a.

A third insulation layer (not shown) may be formed on the single crystalline silicon pattern 206 in a subsequent process, and an additional opening may be formed therein. A contact plug (not shown) may be formed in the additional opening and may contact the single crystalline silicon pattern 206 at a portion corresponding to the second opening 202 in which the lower and upper single crystalline silicon patterns 206a and 206b are stacked. Accordingly, a contact area between the contact plug and the single crystalline silicon pattern 206 may be increased, thereby reducing an electrical resistance of the contact plug.

Figure 13:
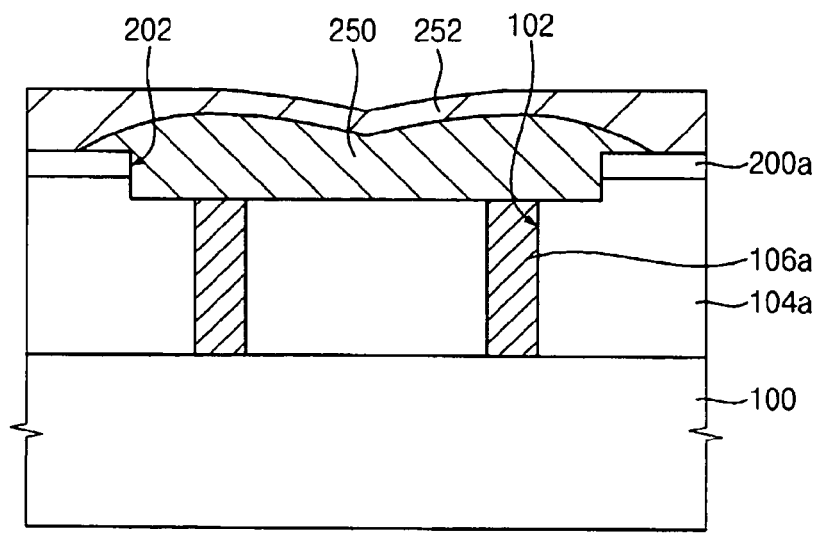
FIGS. 13 to 15 are cross sectional views illustrating a method of forming the silicon thin layer structure according to an example embodiment of the present invention.
Figure 14:
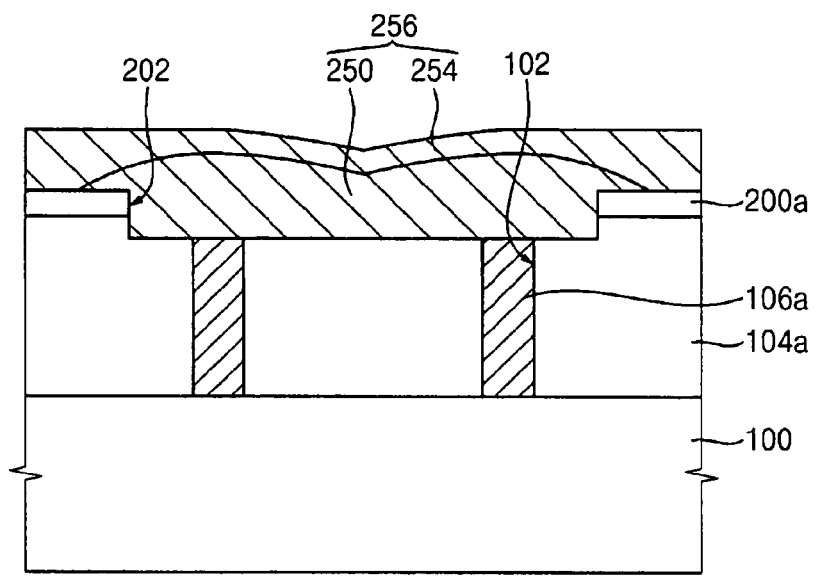
Figure 15:
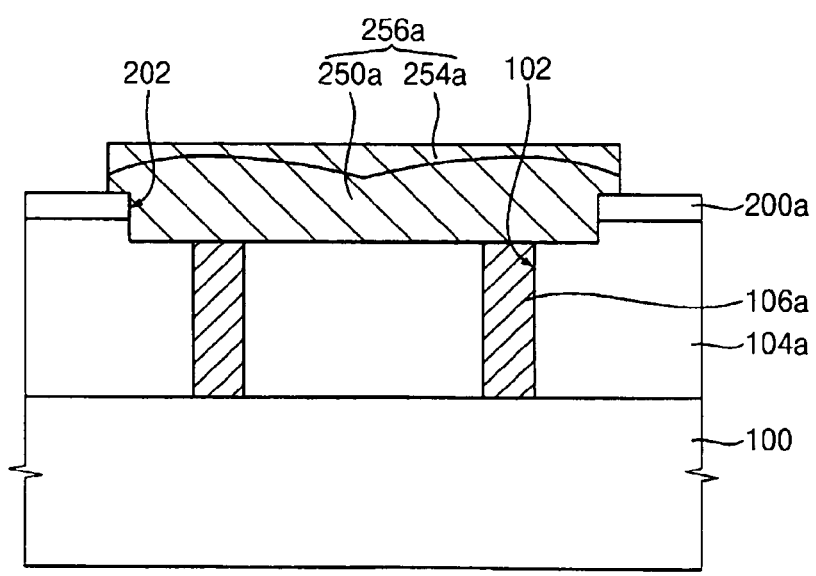

FIGS. 13 to 15 are cross sectional views illustrating a method of forming the silicon thin layer structure according to an example embodiment of the present invention. The method of forming the silicon thin layer structure according to the example embodiment of the present invention is the same as in the previously described example embodiments of the present invention except for the processing for forming a single crystalline silicon pattern as a channel layer. Accordingly, a detailed description of the processing that has been previously described is omitted hereinafter.

As previously described with reference to FIGS. 3 and 4 and FIGS. 9 to 11, a first insulation pattern 104a, a seed pattern 106a and a second insulation pattern 200a may be formed on a substrate 100 and a second opening 202 may be formed through the first and second insulation patterns 104a and 200a, so that the seed pattern 106a may be exposed through the second opening 202, as shown in FIG. 11.

Referring to FIG. 13, a selective epitaxial growth (SEG) process may be performed using the seed pattern 106a exposed through the second opening 202 as a seed, so that a first preliminary single crystalline silicon layer 250 is grown in the second opening 202 and on the second insulation pattern 200a around the first preliminary single crystalline silicon layer 250. According to an example embodiment of the present invention, a whole top surface of the second insulation pattern 200a may not be covered with the first preliminary single crystalline silicon layer 250, so that the second insulation pattern 200a may be partially exposed despite the first preliminary single crystalline silicon layer 250 thereon.

An amorphous silicon layer 252 may be formed on the second insulation pattern 200a and on the first preliminary single crystalline silicon layer 250 by a chemical vapor deposition (CVD) process, so that the top surface of the second insulation pattern 200a is completely covered with the amorphous silicon layer 252.

Referring to FIG. 14, amorphous silicon in the amorphous silicon layer 252 may be transformed into single crystalline silicon by a heat treatment, thereby forming a second preliminary single crystalline silicon layer 254 on the first preliminary single crystalline silicon layer 250 and the second insulation pattern 200a. Accordingly, a single crystalline silicon layer 256 may include the first preliminary single crystalline silicon layer 250 and the second preliminary single crystalline silicon layer 256 on the first preliminary single crystalline silicon layer 250.

In a heat treatment for transforming the amorphous silicon into single crystalline silicon, when the heat treatment is performed at a temperature lower than about 570° C., the transition of the amorphous silicon into single crystalline silicon is difficult to generate and when the heat treatment is performed at a temperature higher than about 650° C., a chemical control on the transition of the amorphous silicon into single crystalline silicon is difficult due at least in part to a rapid chemical reaction. According to an example embodiment of the present invention, the heat treatment is performed at a temperature ranging from about 570° C. to about 650° C. For example, the heat treatment is performed at a temperature ranging from about 600° C. to about 620° C.

Further, amorphous silicon may be transformed into single crystalline silicon by irradiating a laser as well as the above heat treatment.

Referring to FIG. 15, the single crystalline silicon layer 256 may be removed and planarized by a chemical mechanical polishing (CMP) process, so that the single crystalline silicon layer 256 has a thickness ranging from about 300 Å to about 3000 Å from a top surface of the second insulation pattern 200a.

The single crystalline silicon layer 256 may then partially removed by a patterning process, so the single crystalline silicon layer 256 remains in the second opening 202 and on the second insulation pattern 200a around the second opening 202. As a result, a lower single crystalline silicon pattern 250a may be formed in the second opening 202 and an upper single crystalline silicon pattern 254a may be formed on the second insulation pattern 200a and the lower single crystalline silicon pattern 250a, so that the lower single crystalline silicon pattern 250a is covered with the upper single crystalline silicon pattern 254a.

Accordingly, a single crystalline silicon pattern 256a may include the lower single crystalline silicon pattern 250a and the upper single crystalline silicon pattern 254a that are sequentially stacked on the seed pattern 106a and the first insulation pattern 104a.

Figure 16:
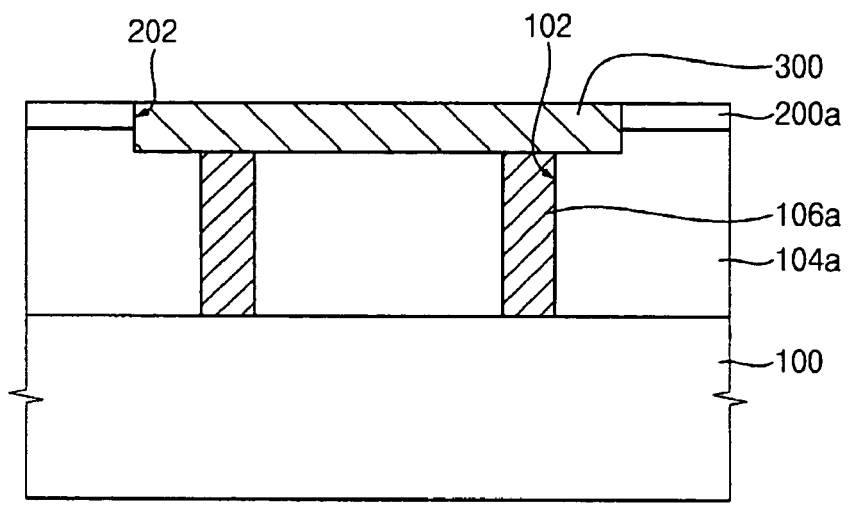
FIGS. 16 to 17 are cross sectional views illustrating a method of forming a silicon thin layer structure according an example embodiment of the present invention.
Figure 17:
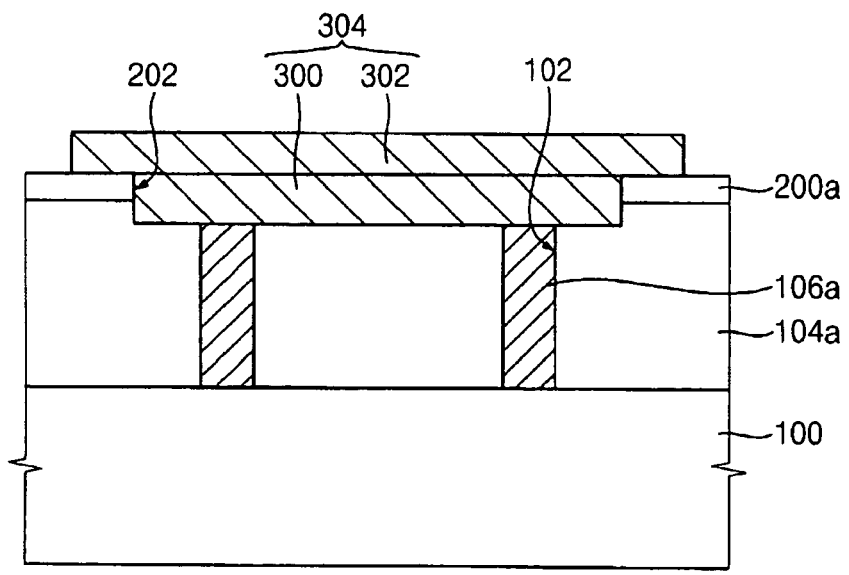

FIGS. 16 to 17 are cross sectional views illustrating a method of forming the silicon thin layer structure according to an example embodiment of the present invention. The method of forming the silicon thin layer structure according to the example embodiment is the same as previously described with respect to example embodiments of the present invention except the processing for forming a single crystalline silicon pattern as a channel layer. A detailed description on the same processing as previously is omitted hereinafter for the sake of brevity.

In the same process as previously described with reference to FIGS. 3 and 4 and FIGS. 9 to 11, a first insulation pattern 104a, a seed pattern 106a and a second insulation pattern 200a may be formed on a substrate 100 and a second opening 202 may be formed through the first and second insulation patterns 104a and 200a, so that the seed pattern 106a may be exposed through the second opening 202, as shown in FIG. 11.

According to an example embodiment of the present invention, the second insulation pattern 200a is formed to a thickness greater than the lower single crystalline silicon pattern. A reason the second insulation pattern 200a has a thickness greater than the lower single crystalline silicon pattern is described hereafter.

Referring to FIG. 16, a selective epitaxial growth (SEG) process may be performed using the seed pattern 106a exposed through the second opening 202 as a seed, so that a first preliminary single crystalline silicon layer (not shown) is grown to sufficiently fill the second opening 202.

A capping layer (not shown) may be formed on the first preliminary single crystalline silicon layer, and the capping layer and the first preliminary single crystalline silicon layer may be removed and polished by a planarization process until a top surface of the second insulation pattern 200a is exposed, so that the first preliminary single crystalline silicon layer remains only in the second opening 202 to thereby form a lower single crystalline silicon pattern 300 in the second opening 202. According to an example embodiment of the present invention, because the thickness of the second insulation pattern 200a is greater than that of the lower single crystalline silicon layer, a control on various conditions of the planarization process enables the lower single crystalline silicon pattern 300 to have a sufficient thickness.

Referring to FIG. 17, a selective epitaxial growth (SEG) process may be performed using the lower single crystalline silicon pattern 300 in the second opening 202 as a seed, so that a single crystalline silicon layer (not shown) may be grown on the second insulation pattern 200a around the second opening 202, and the lower single crystalline silicon pattern 300 may be covered with the single crystalline silicon layer.

While the example embodiment of the present invention described above discloses that the single crystalline silicon layer is formed by an SEG process, a heat treatment on an amorphous silicon layer or any other process known to one of the ordinary skill in the art may also be utilized in place of the SEG process. In a heat treatment process on the amorphous silicon layer, amorphous silicon in the amorphous silicon layer may be transformed into single crystalline silicon, thereby forming the single crystalline silicon layer.

According to an example embodiment of the present invention, the single crystalline silicon layer is formed to a thickness ranging from about 300 Å to about 3000 Å from a top surface of the second insulation pattern 200a.

The single crystalline silicon layer may then be partially removed by a patterning process, so the single crystalline silicon layer remains in the second opening 202 and on the second insulation pattern 200a around the second opening 202. As a result, the lower single crystalline silicon pattern 300 may be formed in the second opening 202 and the upper single crystalline silicon pattern 302 may be formed on the second insulation pattern 200a and the lower single crystalline silicon pattern 300, so that the lower single crystalline silicon pattern 300 is covered with the upper single crystalline silicon pattern 302.

Accordingly, the single crystalline silicon pattern according to an example embodiment of the present invention includes the lower single crystalline silicon pattern 300 and the upper single crystalline silicon pattern 302 that are sequentially stacked on the seed pattern 106a and the first insulation pattern 104a.

According to an example embodiment of the present invention, the thin layer structure may include a single crystalline silicon pattern having a uniform thickness or a thickness that is greater at a portion around a seed pattern than any other portions thereof, thereby improving electrical reliability of a semiconductor device including the thin layer structure.

A central thickness of the single crystalline silicon pattern around the seed pattern may be substantially identical to a peripheral thickness thereof, thereby reducing or preventing a thinning defect occurring in conventional devices and improving electrical characteristics of a semiconductor device including the thin layer structure as a multilayer structure.

Although example embodiments of the present invention have been described, it is understood that the present invention should not be limited to these example embodiments of the present invention, but that various changes and/or modifications can be made by one skilled in the art within the spirit and scope of the present invention.

What is claimed is:

1. A method of forming a thin layer structure, comprising:
    forming a first preliminary insulation pattern on a substrate, the first preliminary insulation pattern including a first opening through which the substrate is partially exposed;
    forming at least one preliminary seed pattern in the first opening, the at least one preliminary seed pattern includes single crystalline silicon;
    forming a second insulation layer on the first preliminary insulation pattern and the at least one preliminary seed pattern;
    forming a second insulation pattern, a first insulation pattern and at least one seed pattern by partially etching the second insulation layer, the first preliminary insulation pattern and the at least one preliminary seed pattern, the second insulation pattern including a second opening having a flat bottom; and
    forming at least one single crystalline silicon pattern in the second opening.

2. The method of claim 1, wherein forming the second insulation pattern, the first insulation pattern and the at least one seed pattern includes:
    forming a photoresist pattern on the second insulation layer, the second insulation layer being partially exposed through the photoresist pattern at a portion corresponding to the at least one preliminary seed pattern and the second preliminary insulation pattern around the at least one preliminary seed pattern;
    performing a first etching process on the second insulation layer to a depth using the photoresist pattern as an etching mask such that the at least one preliminary seed pattern remains covered with the second insulation layer, thereby forming a second preliminary opening; and
    performing a second etching process on the second insulation layer, the first preliminary insulation pattern and the at least one preliminary seed pattern in the second preliminary opening.

3. The method of claim 2, wherein an etching rate of the first etching process with respect to the second insulation layer is greater than an etching rate of the second etching process with respect to the second insulation layer.

4. The method of claim 2, wherein the first etching process includes a dry etching process using trifluoromethane ($CHF_3$) gas and oxygen gas as an etching gas.

5. The method of claim 2, wherein the second insulation layer, the first preliminary insulation pattern and the at least one preliminary seed pattern in the second preliminary opening are etched away at a substantially same etching rate in the second etching process.

6. The method of claim 5, wherein the second etching process includes a dry etching process using carbon tetrafluoride ($CF_4$) gas and oxygen gas as an etching gas.

7. The method of claim 2, wherein the at least one preliminary seed pattern is etched away in the second etching process.

8. The method of claim 1, wherein forming the single crystalline silicon pattern includes:
    forming a single crystalline silicon layer on the second insulation pattern to a thickness sufficient to fill the second opening; and
    planarizing the single crystalline silicon layer until a top surface of the second insulation pattern is exposed.

9. The method of claim 1, wherein forming the at least one single crystalline silicon pattern includes:
    forming a lower single crystalline silicon pattern in the second opening and an upper single crystalline silicon pattern on the lower single crystalline silicon pattern.

10. The method of claim 9, wherein forming the lower and upper single crystalline silicon pattern includes:
    forming a single crystalline silicon layer on the second insulation pattern to a thickness sufficient to fill the second opening; and
    patterning the single crystalline silicon layer such that the single crystalline silicon layer remains in the second opening and on the second insulation pattern around the second opening to thereby form the lower single crystalline silicon pattern in the second opening and the upper single crystalline silicon pattern on the lower single crystalline silicon pattern and the second insulation pattern around the second opening.

11. The method of claim 10, wherein a top surface of the single crystalline silicon layer is further planarized by a planarization process.

12. The method of claim 10, wherein the single crystalline silicon layer is formed by a selective epitaxial growth (SEG) process.

13. The method of claim 10, wherein forming the single crystalline silicon layer includes:
    forming a preliminary single crystalline silicon layer on the second insulation pattern to a thickness sufficient to fill the second opening by a selective epitaxial growth (SEG) process;
    polishing the preliminary single crystalline silicon layer until a top surface of the second insulation pattern is exposed;
    forming an amorphous silicon layer on the second insulation pattern and the preliminary single crystalline silicon layer; and
    performing a heat treatment on the amorphous silicon layer, thereby transforming amorphous silicon in the amorphous silicon layer into single crystalline silicon.

14. The method of claim 10, wherein forming the single crystalline silicon layer includes:
    forming a preliminary single crystalline silicon layer on the second insulation pattern to a thickness sufficient to fill the second opening by a selective epitaxial growth (SEG) process;
    forming an amorphous silicon layer on the preliminary single crystalline silicon layer; and
    performing a heat treatment on the amorphous silicon layer, thereby transforming amorphous silicon in the amorphous silicon layer into single crystalline silicon.

15. The method of claim 10, wherein the single crystalline silicon layer is formed to a thickness ranging from about 300 Å to about 3000 Å from a top surface of the second insulation pattern.

16. The method of claim 1, wherein the thickness of the at least one single crystalline silicon is substantially uniform.

17. The method of claim 1, wherein a silicon oxide fence is prevented from forming around the at least one seed pattern.

* * * * *